(12) United States Patent
Betke et al.

(10) Patent No.: US 11,695,424 B2
(45) Date of Patent: Jul. 4, 2023

(54) DISTORTION REDUCTION CIRCUIT

(71) Applicant: International Business Machines Corporation, Armonk, NY (US)

(72) Inventors: Jarrett Betke, Hoffman Estates, IL (US); George Russell Zettles, IV, Rochester, MN (US); Timothy Lindquist, Rochester, MN (US); George Paulik, Rochester, MN (US); Timothy Clyde Buchholtz, Rochester, MN (US); Karl Erickson, Rochester, MN (US); Daniel Ramirez, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/456,207

(22) Filed: Nov. 23, 2021

(65) Prior Publication Data
US 2023/0163774 A1    May 25, 2023

(51) Int. Cl.
| | | |
|---|---|---|
| H04K 1/02 | (2006.01) | |
| H04L 25/02 | (2006.01) | |
| H04L 25/49 | (2006.01) | |
| H03M 1/12 | (2006.01) | |
| H03L 7/14 | (2006.01) | |
| H03L 7/091 | (2006.01) | |

(52) U.S. Cl.
CPC .......... *H03M 1/1245* (2013.01); *H03L 7/091* (2013.01); *H03L 7/146* (2013.01)

(58) Field of Classification Search
CPC ... H03M 1/1245; H03M 1/0614; H03L 7/146; H03L 7/091
USPC ................................. 375/296, 285, 284, 232
See application file for complete search history.

(56) References Cited

U.S. PATENT DOCUMENTS

| | | | |
|---|---|---|---|
| 5,614,903 A | | 3/1997 | Oyama |
| 6,097,324 A | * | 8/2000 | Myer ................. H03M 1/0614 341/118 |
| 6,774,834 B2 | | 8/2004 | Dartois |
| 8,295,214 B2 | | 10/2012 | Chandra et al. |
| 8,532,238 B2 | | 9/2013 | Han |
| 8,981,980 B2 | | 3/2015 | Petrovic |
| 9,806,919 B2 | | 10/2017 | Midya et al. |
| 10,374,781 B2 | | 8/2019 | Khandani |

FOREIGN PATENT DOCUMENTS

| | | |
|---|---|---|
| CN | 1719818 A | 1/2006 |
| CN | 103226720 B | 8/2016 |
| WO | 2020103434 A1 | 5/2020 |

* cited by examiner

*Primary Examiner* — Phuong Phu
(74) *Attorney, Agent, or Firm* — Patterson + Sheridan, LLP (57) ABSTRACT

An apparatus includes a sampling circuit, a sense circuit, and a tuning circuit. The sampling circuit samples an input signal according to a sampling clock signal to produce a sampled signal. The sense circuit determines a scaling factor based on a distortion in the sampled signal caused by the sampling clock signal. The tuning circuit generates an offset signal based on the sampling clock signal and the scaling factor. The offset signal reduces the distortion in the sampled signal caused by the sampling clock signal.

17 Claims, 8 Drawing Sheets

DISTORTION REDUCTION CIRCUIT

BACKGROUND

The present disclosure relates to digital signal processing (DSP), and more specifically, to reducing distortions in sampled signals. In digital signal processing, generating high-fidelity waveforms is often accomplished using devices such as a high-speed digital-to-analog converter (DAC). The fidelity of a DAC-based waveform is determined by several metrics (e.g., spurious free dynamic range (SFDR), signal to noise ratio (SNR), signal to noise and distortion (SINAD), and total harmonic distortion (THD)), each measuring different spectral relationships of the output waveform. The general strategy for designing a DAC-based waveform generator includes choosing an ideal sampling frequency for the application. This sampling frequency influences the fidelity of the output waveform for some applications.

The typical practice for selecting a sampling frequency is to select a frequency outside the desired output frequency bandwidth. This practice allows the designer to apply a low pass filter (LPF) on the output of the DAC to remove the distortion (e.g., undesired spectral content) that may be introduced by the sampling frequency. However, one or more problems may arise when the desired output frequency bandwidth is large or wide. For example, the standard practice of using an LPF on a wideband radio frequency application may affect output waveform fidelity if the sampling frequency cannot be placed with enough margin from the designed output frequency bandwidth. Additionally, the standard practices and solutions above may not be ideal in certain applications (e.g., low temperature applications, quantum computing, and high bandwidth analog design).

SUMMARY

According to an embodiment, an apparatus includes a sampling circuit, a sense circuit, and a tuning circuit. The sampling circuit samples an input signal according to a sampling clock signal to produce a sampled signal. The sense circuit determines a scaling factor based on a distortion in the sampled signal caused by the sampling clock signal. The tuning circuit generates an offset signal based on the sampling clock signal and the scaling factor. The offset signal reduces the distortion in the sampled signal caused by the sampling clock signal. Other embodiments include a method performed by the apparatus.

According to another embodiment, an apparatus includes a sense circuit and a tuning circuit. The sense circuit determines a scaling factor based on a distortion in a sampled signal caused by a sampling clock signal used to generate the sampled signal. The tuning circuit generates an offset signal based on the sampling clock signal and the scaling factor. The offset signal reduces the distortion in the sampled signal caused by the sampling clock signal. Other embodiments include a method performed by the apparatus.

DETAILED DESCRIPTION

This disclosure describes a system that reduces distortions in sampled signals using a feedback loop. Specifically, the system includes a sense circuit and a tuning circuit that operate together to offset or reduce distortions in a sampled signal caused by a sampling clock signal. The sense circuit analyzes the sampled signal to determine a scaling factor for offsetting the distortion. The tuning circuit then uses the scaling factor to generate an offset signal. For example, the tuning circuit may apply the scaling factor to a phase shifted version of the sampling clock signal. As another example, the tuning circuit may apply the scaling factor to an oscillating signal generated according to the sampling clock signal. The system then applies the offset signal to a sampled signal (e.g., using a mixer) to reduce the distortion in the sampled signal, in certain embodiments. In some embodiments, the system is a circuit designed on a digital-to-analog converter (DAC) chip (e.g., on the same silicon as the DAC) that utilizes a feedback loop architecture to create an amplitude-tuned and phase-shifted sampling clock to achieve compensatory sampling content cancellation.

Figure 1:
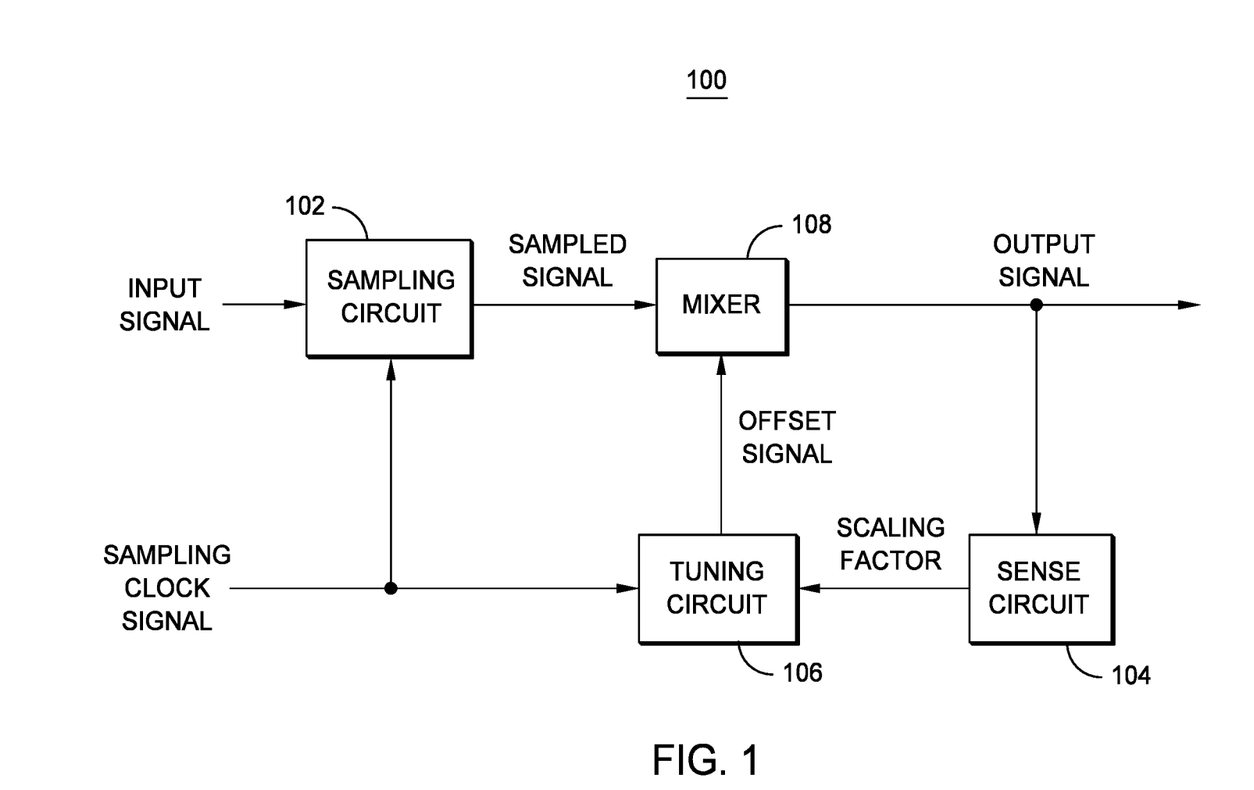
FIG. 1 illustrates an example system.

FIG. 1 illustrates an example system 100. As seen in FIG. 1, the system 100 includes a sampling circuit 102, a sense circuit 104, a tuning circuit 106, and a mixer 108. Generally, the sampling circuit 102 samples an input signal according to a sampling clock signal. The sense circuit 104 and the tuning circuit 106 operate together to generate an offset signal based on the sampled signal and the sampling clock signal. The offset signal is then combined with the sampled signal to reduce or offset a distortion caused by the sampling clock signal, in certain embodiments. This offset or cancellation routine may be performed during startup or when temperature or other effects (e.g., voltage drift) are detected. In some embodiments, the system 100 is an integrated circuit or the components of the system 100 are implemented on the same piece of semiconductor (e.g., silicon).

The sampling circuit 102 is a circuit (e.g., a DAC) that samples an input signal to the system 100 according to a sampling clock signal provided to the system 100. For example, the sampling circuit 102 may sample a value of the input signal at the zero crossings of the sampling clock signal or when the sampling clock signal periodically reaches a certain value. The sampled signal may include distortions caused by the sampling clock signal. For example, the sampled signal may include distortions at the frequency of the sampling clock signal. Other components of the system 100 may analyze the sampled signal to generate an offset signal that reduces or offsets the distortion caused by the sampling clock signal.

The sense circuit 104 and the tuning circuit 106 form a feedback loop that provides an offset signal to the sampled signal. The mixer 108 combines the sampled signal with the offset signal to generate an output signal. Prior to the sense circuit 104 and the tuning circuit 106 providing the offset signal to the mixer 108, the output signal from the mixer 108 is mainly the sampled signal. The sense circuit 104 analyzes the sampled signal to determine a scaling factor. For example, the sense circuit 104 may detect or measure the power of the sampled signal at the frequency of the sampling clock signal (e.g., using circuitry that measures the power level of the peak amplitude at the frequency of the sampling clock signal). The sense circuit 104 then uses the measured power to produce a scaling factor that may be used to offset the distortion caused by the sampling clock signal. In some embodiments, the scaling factor is the multiplicative inverse of the measured power of the sampled signal at the frequency of the sampling clock signal. The sense circuit 104 communicates the scaling factor to the tuning circuit 106.

The tuning circuit 106 generates the offset signal using the sampling clock signal and the scaling factor. In some embodiments, the tuning circuit 106 shifts the sampling clock signal and then applies the scaling factor directly to the shifted clock signal to produce the offset signal. In other embodiments, the tuning circuit 106 includes a numerically controlled oscillator or a phase locked loop that generates an oscillating signal based on the sampling clock signal. The tuning circuit 106 then applies the scaling factor directly to the oscillating signal to generate the offset signal. The tuning circuit 106 communicates the offset signal to the mixer 108.

The mixer 108 combines the offset signal with the sampled signal to update the output signal (e.g., to destructively interfere with the distortion caused by the sampling clock signal). In some embodiments, the mixer 108 adds the offset signal to the sampled signal or subtracts the offset signal from the sampled signal to update the output signal. In other embodiments, the mixer 108 multiplies the sampled signal with the offset signal (e.g., through a convolution) or divides the sampled signal by the offset signal to update the output signal. By combining the sampled signal and the offset signal, the mixer 108 reduces or offsets the distortion in the sampled signal caused by the sampling clock signal. As a result, the mixer 108 may remove the distortion from the output signal. In some embodiments, the system 100 uses a circuit other than the mixer 108 (e.g., an adder) to combine the sampled signal with the offset signal.

In certain embodiments, a user may provide one or more of signals to the system 100. For example, the user may provide the input signal and the sampling clock signal to the system 100. As another example, the user may provide a cancellation signal that the system 100 uses to generate the offset signal. In this manner, the user has control over the offset signal and the destructive interference provided by the system 100.

Figure 2:
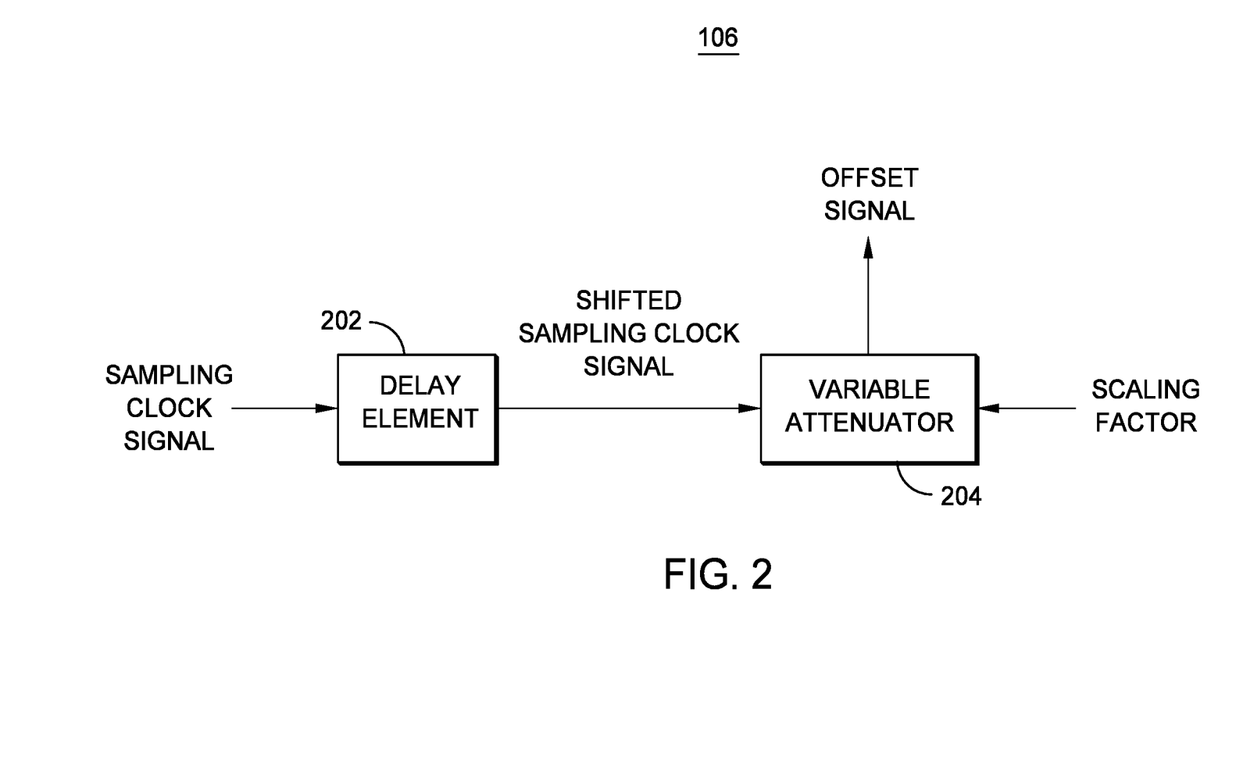
FIG. 2 illustrates an example tuning circuit in the system of FIG. 1.

FIG. 2 illustrates an example tuning circuit 106 in the system 100 of FIG. 1. As seen in FIG. 2, the tuning circuit 106 includes a delay element 202 and a variable attenuator 204. Generally, the delay element 202 and the variable attenuator 204 operate together to produce an offset signal based on a received scaling factor and a received sampling clock signal.

The delay element 202 operates as a phase shifter in the tuning circuit 106. The delay element 202 receives the sampling clock signal and phase shifts the sampling clock signal by introducing delay into the sampling clock signal. In some embodiments, the delay element 202 introduces a 180 degrees phase shift to the sampling clock signal. After adding the phase shift, the delay element 202 produces a shifted sampling clock signal. The delay element 202 communicates the shifted sampling clock signal to the variable attenuator 204.

The variable attenuator 204 receives the scaling factor from the sense circuit 104 (shown in FIG. 1) and the shifted sampling clock signal from the delay element 202. The variable attenuator 204 then applies the scaling factor to the shifted sampling clock signal. For example, the variable attenuator 204 may multiply the shifted sampling clock signal by the scaling factor to produce the offset signal. As a result, the offset signal is a scaled and phase shifted version of the sampling clock signal. The offset signal may then be combined with a sampled signal to remove a distortion at the frequency of the sampling clock signal.

Figure 3:
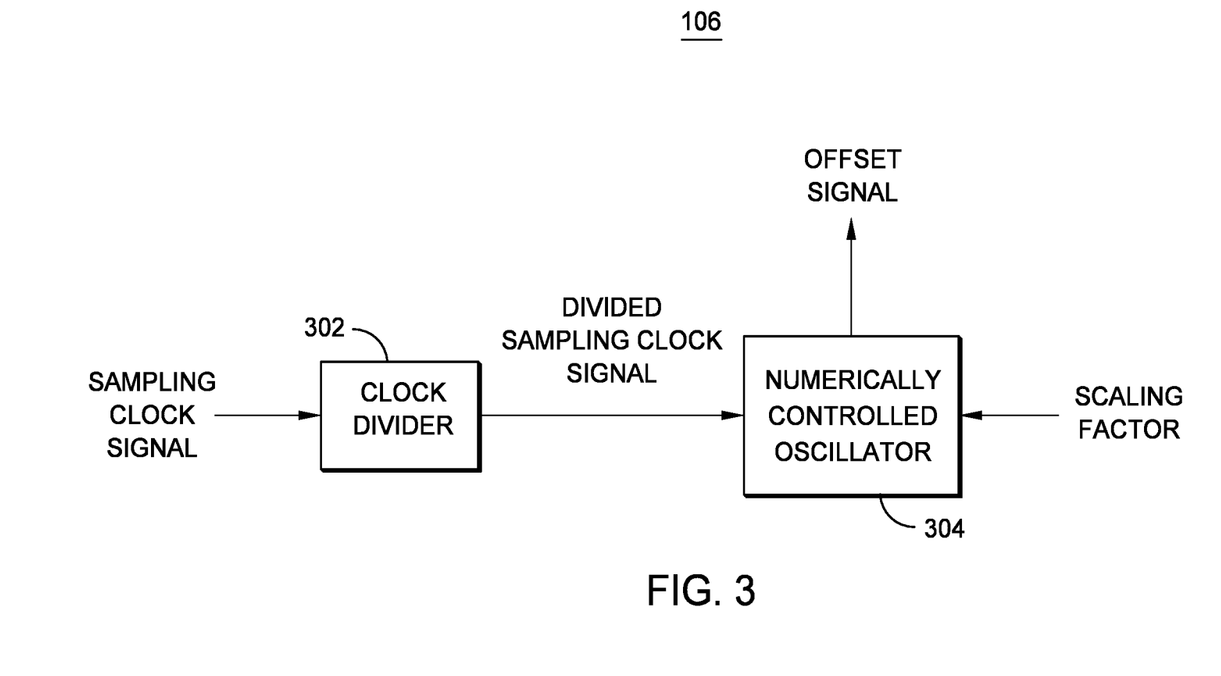
FIG. 3 illustrates an example tuning circuit in the system of FIG. 1.

FIG. 3 illustrates an example tuning circuit 106 in the system 100 of FIG. 1. As seen in FIG. 3, the tuning circuit 106 includes a clock divider 302 and a numerically controlled oscillator 304. Generally, the clock divider 302 and the numerically controlled oscillator 304 operate together to produce the offset signal based on a received sampling clock signal and a received scaling factor. The embodiment of the tuning circuit 106 shown in FIG. 3 is an alternative to the embodiment shown in FIG. 2.

The clock divider 302 receives the sampling clock signal and divides the sampling clock signal to produce a divided sampling clock signal. For example, the clock divider 302 may reduce the frequency of the sampling clock signal by producing a divided sampling clock signal with a frequency that is half, a quarter, or any suitable fraction of the frequency of the sampling clock signal. The clock divider 302 communicates the divided sampling clock signal to the numerically controlled oscillator 304.

The numerically controlled oscillator 304 uses the divided sampling clock signal to generate an oscillating signal. For example, the frequency of the divided sampling clock signal may instruct the numerically controlled oscillator 304 to generate an oscillating signal with a particular frequency. In some embodiments, the numerically controlled oscillator adjusts the phase of the divided sampling clock signal before using the divided sampling clock signal to generate the oscillating signal. The numerically controlled oscillator 304 also receives the scaling factor from the sense circuit 104. The numerically controlled oscillator 304 applies the scaling factor directly to the oscillating signal to produce the offset signal. For example, the numerically controlled oscillator 304 may multiply the oscillating signal by the scaling factor to produce the offset signal. The offset signal is then combined with a sampled signal to reduce or offset a distortion caused by the sampling clock signal.

In some embodiments, the numerically controlled oscillator 304 allows the tuning circuit 106 to generate an offset signal that reduces or offsets distortions at any frequency, including the frequency of the sampling clock signal. By using the numerically controlled oscillator 304, the tuning circuit 106 can generate an offset signal that destructively interferes with signals of any suitable frequency.

Figure 4:
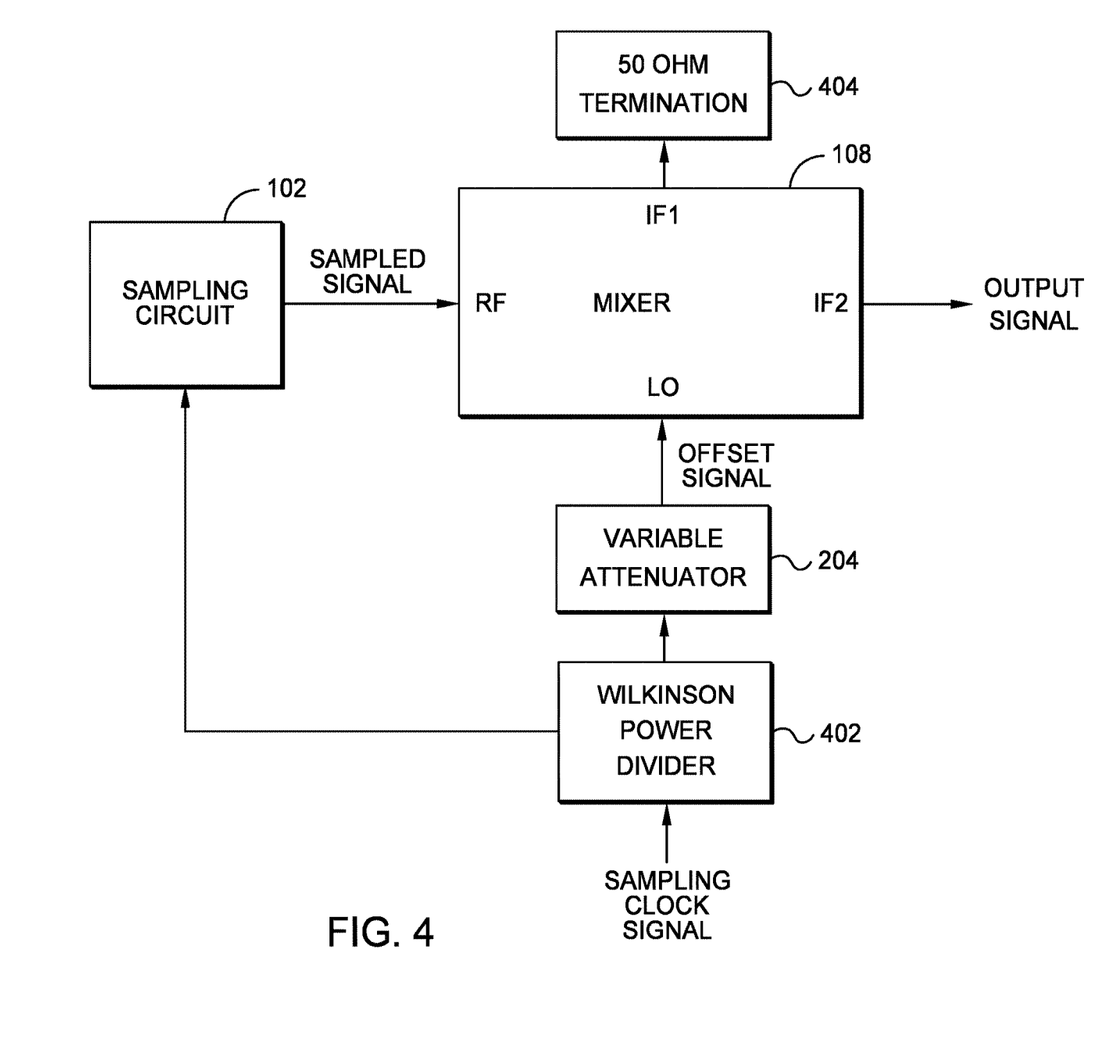
FIG. 4 illustrates an example portion of the system of FIG. 1.

FIG. 4 illustrates an example portion of the system 100 of FIG. 1. As seen in FIG. 4, the portion of the system 100 includes the sampling circuit 102, a mixer 108, the variable attenuator 204, and a Wilkinson power divider 402. The Wilkinson power divider 402 receives and splits the sampling clock signal. The Wilkinson power divider 402 communicates the sampling clock signal to the sampling circuit 102 and to the variable attenuator 204. The sampling circuit 102 then samples an input signal according to the sampling clock signal from the Wilkinson power divider 402 to produce the sampled signal. The sampling circuit 102 communicates the sampled signal to a radio frequency (RF) port on the mixer 108.

The variable attenuator 204 receives the sampling clock signal from the Wilkinson Power Divider 402 and applies a scaling factor to the sampling clock signal to produce the offset signal. The variable attenuator 204 communicates the offset signal to the local oscillator (LO) port on the mixer 108. In some embodiments, a delay element 202 is positioned between the Wilkinson power divider 402 and the variable attenuator 204. The delay element 202 adds a phase shift to the sampling clock signal before the variable attenuator 204 scales the sampling clock signal. As a result, the offset signal from the variable attenuator 204 is a scaled and phase shifted version of the sampling clock signal.

The mixer 108 combines the sampled signal with the offset signal to produce the output signal over an intermediate frequency (IF) port (e.g., port IF2 in the example of FIG. 4). In some embodiments, the mixer 108 multiplies the sampled signal by the offset signal. In some embodiments, a resistor (e.g., a 50 ohm termination 404 in the example of FIG. 4) is connected to another IF port of the mixer 108 (e.g., port IF1 in the example of FIG. 4). By combining the sampled signal and the offset signal, the mixer 108 reduces a distortion in the sampled signal caused by the sampling clock signal.

Figure 5:
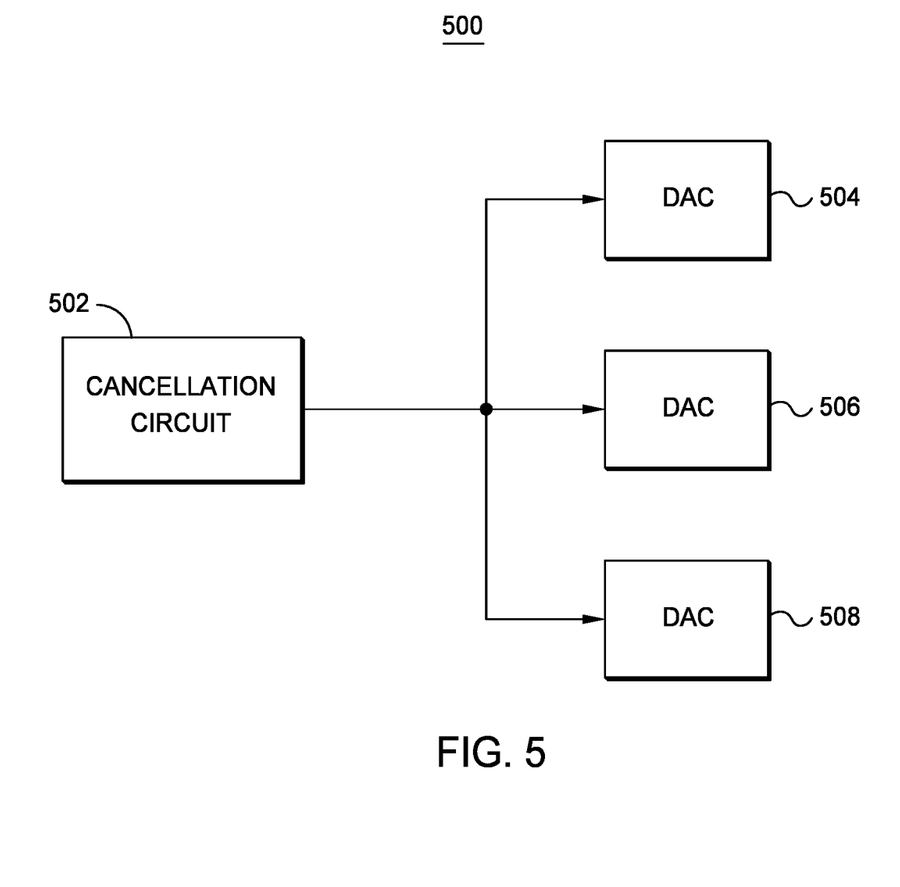
FIG. 5 illustrates an example system.

FIG. 5 illustrates an example system 500. As seen in FIG. 5, the system 500 includes a cancellation circuit 502 and one or more sampling circuits (e.g., DACs 504, 506 and 508). Generally, the cancellation circuit 502 may include one or more components of the system 100 that operate together to generate offset signals. The cancellation circuit 502 generates an offset signal used by the DACs 504, 506 and 508 to reduce or offset distortions caused by a sampling clock signal. As a result, the DACs 504, 506 and 508 may sample different input signals according to a sampling clock signal to produce sampled signals. The sampled signals are then combined with the offset signal produced by the cancellation circuit 502 to produce output signals. Distortions in the sampled signals at the frequency of the sampling clock signal may be reduced or offset by the offset signal from the cancellation circuit 502. The example of FIG. 5 shows that the components and functions described with respect to the system 100 in FIG. 1 may be applied to more than one sampling circuit (e.g., DAC) simultaneously to produce multiple output signals.

In certain embodiments where an analog signal is being provided by an external source, there may be many ways to ensure timing. For example, a scope limited application may be used so that on-chip timing analysis lines up with a frequency range. As another example, phase delay circuitry may be used to add a tunable phase delay. During a calibration routine, a user could adjust the delay to the signal to achieve the desired result. As another example, delay may be shifted at the source. In the case of an on-chip offset signal, the phase shift can be performed in a more automated fashion (e.g., using a numerically controlled oscillator or a phase locked loop).

Figure 6A:
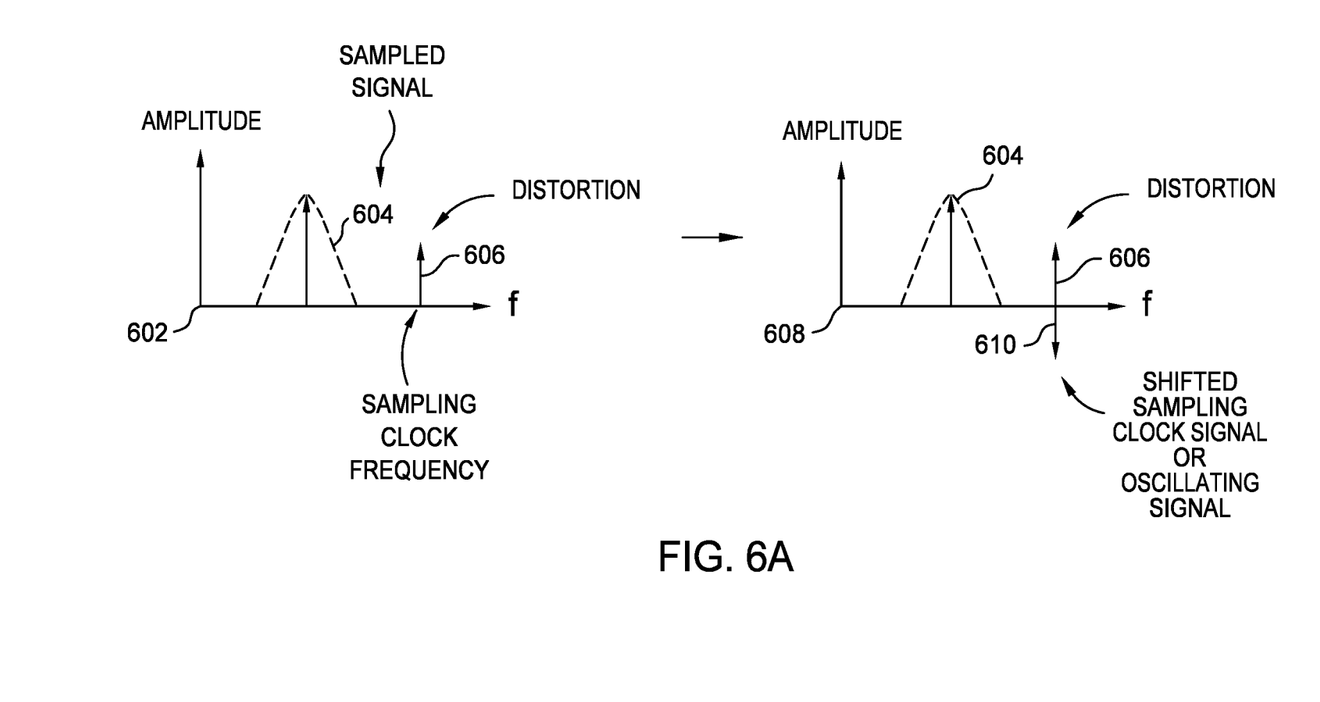
FIGS. 6A and 6B illustrate an example operation of the system of FIG. 1.
Figure 6B:
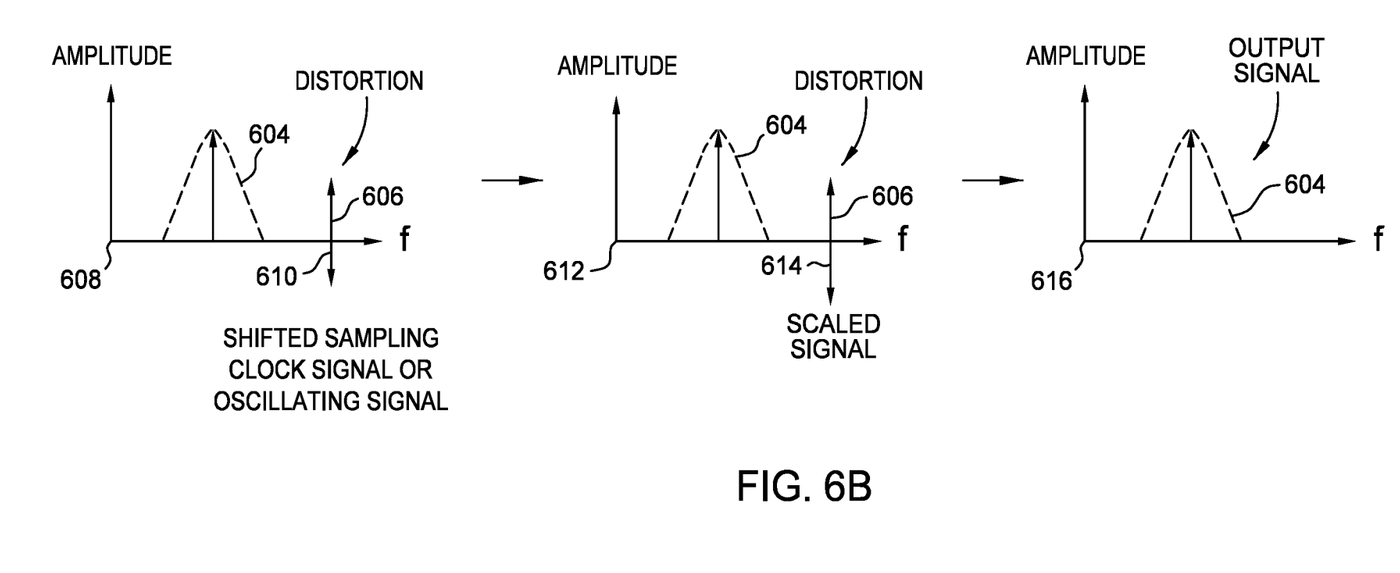

FIGS. 6A and 6B illustrate an example operation of the system 100 of FIG. 1. Various components of the system 100 shown in FIG. 1 may perform the process shown in FIGS. 6A and 6B. As seen in FIG. 6A, the process begins with the sampling circuit 102 sampling an input signal according to a sampling clock signal to produce a sampled signal. The sampled signal includes a sampled portion indicated by the triangular region 604 in the graph 602 and a distortion indicated by an arrow 606 on the right side of the graph 602. Notably, the distortion is introduced by the sampling clock signal and has the same frequency as the sampling clock signal. After the sampling circuit 102 provides the sampled signal, the tuning circuit 106 produces a shifted sampling clock signal or oscillating signal. For example, the tuning circuit 106 may add a phase shift to the sampling clock signal to produce a shifted sampling clock signal, or the tuning circuit 106 may include a numerically controlled oscillator that generates an oscillating signal based on the sampling clock signal. As seen in FIG. 6A, the shifted sampling clock signal or the oscillating signal have the same frequency as the distortion (as indicated by the arrow 610 in the graph 608). However, the shifted sampling clock signal or the oscillating signal is out of phase with the distortion.

The process continues in FIG. 6B with the tuning circuit 106 applying a scaling factor to the shifted sampling clock signal or the oscillating signal to produce a scaled signal (represented by the arrow 614 in the graph 612). For example, the tuning circuit 106 may receive a scaling factor from the sense circuit 104. The sense circuit 104 may have determined the scaling factor by determining the power of the sampled signal at the frequency of the sampling clock signal. By applying the scaling factor to the shifted sampling clock signal or the oscillating signal, the tuning circuit 106 produces the scaled signal, which has a magnitude near or similar to the magnitude of the distortion.

The scaled signal is then combined with the sampled signal to produce the output signal (represented by the graph 616). As seen in FIG. 6B, the scaled signal reduces or offsets the distortion when combined with the sampled signal. In some embodiments, the scaled signal offsets the distortion such that the output signal does not include the distortion. In some embodiments, a mixer 108 combines the scaled signal with the sampled signal to reduce or offset the distortion.

Figure 7:
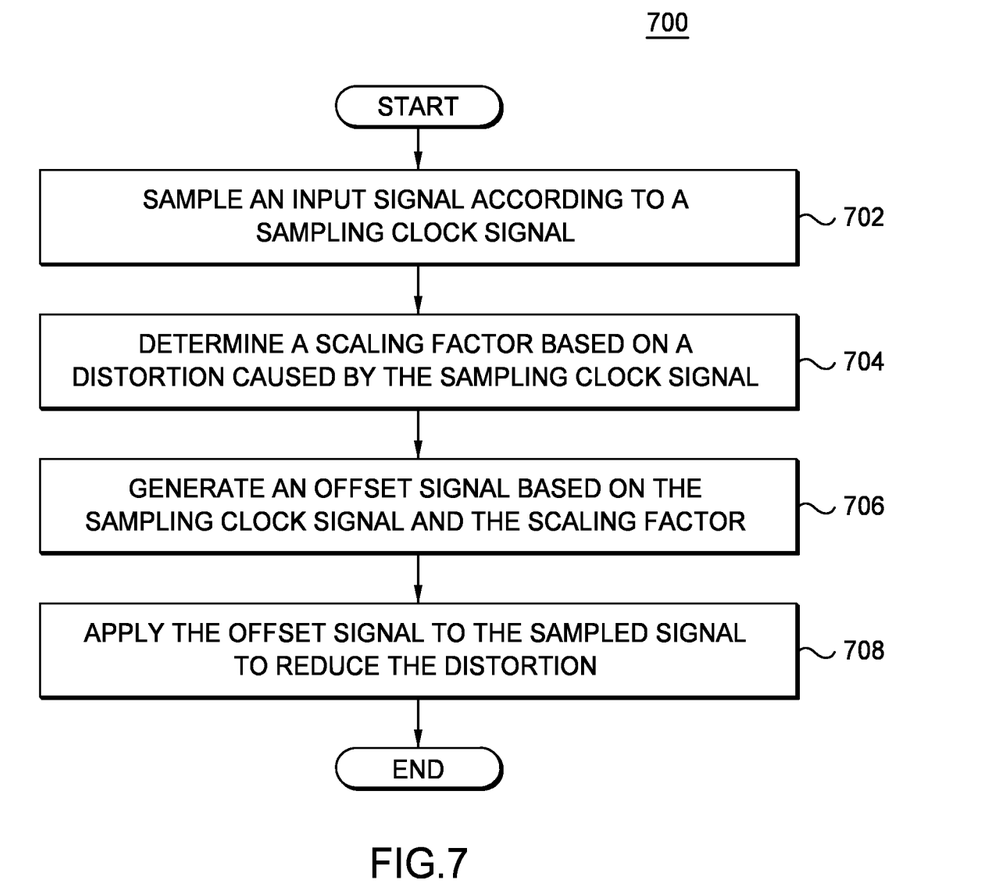
FIG. 7 is a flowchart of an example method performed in the system of FIG. 1.

FIG. 7 is a flowchart of an example method 700 performed in the system 100 of FIG. 1. In particular embodiments, various components of the system 100 perform the method 700. By performing the method 700, the system 100 uses a feedback loop to reduce or offset the distortion in a sampled signal caused by a sampling clock signal.

In block 702, a sampling circuit 102 samples an input signal according to a sampling clock signal. For example, the sampling circuit 102 may be a DAC that samples the value of the input signal at the zero crossings of the sampling clock signal. The sampled signal produced by the sampling circuit 102 may include a distortion at the frequency of the sampling clock signal.

In block 704, a sense circuit 104 determines a scaling factor based on the distortion caused by the sampling clock signal. For example, the sense circuit 104 may analyze the sampled signal from the sampling circuit 102 to measure a power of the sampled signal at the frequency of the sampling clock signal. This power may be the power of the distortion introduced by the sampling clock signal. The sampling circuit then produces the scaling factor based on this measured power. For example, the scaling factor may be the multiplicative inverse of the measured power.

In block 706, a tuning circuit 106 generates an offset signal, based on the sampling clock signal and the scaling factor. In some embodiments, the tuning circuit 106 includes a delay element 202 and a variable attenuator 204. The delay element 202 adds a phase shift to the sampling clock signal, and the variable attenuator 204 applies the scaling factor to the shifted sampling clock signal (e.g., multiplying the shifted sampling clock signal by the scaling factor) to produce the offset signal. In some embodiments, the tuning circuit 106 includes a clock divider 302 and a numerically controlled oscillator 304. The clock divider 302 produces a divided sampling clock signal with a reduced frequency relative to the sampling clock signal. The numerically controlled oscillator 304 generates an oscillating signal according to the divided sampling clock signal and applies the scaling factor directly to the oscillating signal (e.g., multiplies the oscillating signal by the scaling factor) to generate the offset signal.

In block 708, a mixer 108 applies the offset signal to the sampled signal to reduce the distortion. The mixer 108 may combine the sampled signal with the offset signal (e.g., through adding, subtracting, multiplying, or dividing the signals). In particular embodiments, combining the sampled signal with the offset signal reduces or offsets the distortion in the sampled signal caused by the sampling clock signal.

In summary, a system 100 reduces distortions in sampled signals using a feedback loop. Specifically, the system 100 includes a sense circuit 104 and a tuning circuit 106 that operate together to offset or reduce distortions in a sampled signal caused by a sampling clock signal. The sense circuit 104 analyzes the sampled signal to determine a scaling factor for offsetting the distortion. The tuning circuit 106 then uses the scaling factor to generate an offset signal. For example, the tuning circuit 106 may apply the scaling factor to a phase shifted version of the sampling clock signal. As another example, the tuning circuit 106 may apply the scaling factor to an oscillating signal generated according to the sampling clock signal. The system 100 then applies the offset signal to a sampled signal (e.g., using a mixer 108) to reduce the distortion in the sampled signal, in certain embodiments.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the preceding, reference is made to embodiments presented in this disclosure. However, the scope of the present disclosure is not limited to specific described embodiments. Instead, any combination of the features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the aspects, features, embodiments and advantages discussed herein are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Aspects of the present disclosure may take the form of an entirely hardware embodiment, an entirely software embodiment (including firmware, resident software, microcode, etc.) or an embodiment combining software and hardware aspects that may all generally be referred to herein as a "circuit," "module" or "system."

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing is directed to embodiments of the present disclosure, other and further embodiments of the disclosure may be devised without departing from the basic scope thereof, and the scope thereof is determined by the claims that follow.

What is claimed is:

1. An apparatus comprising:
a sampling circuit configured to sample an input signal according to a sampling clock signal to produce a sampled signal;
a sense circuit configured to determine a scaling factor based on a distortion in the sampled signal caused by the sampling clock signal;
a tuning circuit configured to generate an offset signal based on the sampling clock signal and the scaling factor; and
a mixer configured to multiply the offset signal with the sampled signal to reduce the distortion in the sampled signal caused by the sampling clock signal.

2. The apparatus of claim 1, wherein the tuning circuit comprises:
a phase shifter configured to shift a phase of the sampling clock signal to produce a shifted sampling clock signal; and
a variable attenuator configured to apply the scaling factor to the shifted sampling clock signal to produce the offset signal.

3. The apparatus of claim 1, wherein the tuning circuit comprises:
a clock divider configured to divide the sampling clock signal to produce a divided sampling clock signal; and
a numerically controlled oscillator configured to:
generate an oscillating signal based on the divided sampling clock signal; and
apply the scaling factor to the oscillating signal to produce the offset signal.

4. The apparatus of claim 3, wherein the numerically controlled oscillator is further configured to apply a phase adjustment to the divided sampling clock signal before generating the oscillating signal.

5. The apparatus of claim 1, wherein the sense circuit determines the scaling factor based on a detected power of the sampled signal.

6. The apparatus of claim 1, further comprising a second sampling circuit configured to sample a second input signal according to the sampling clock signal to produce a second sampled signal, wherein offset signal further reduces distortion in the second sampled signal caused by the sampling clock signal.

7. A method comprising:
sampling an input signal according to a sampling clock signal to produce a sampled signal;
determining a scaling factor based on a distortion in the sampled signal caused by the sampling clock signal;
generating an offset signal based on the sampling clock signal and the scaling factor; and
multiplying the offset signal with the sampled signal to reduce the distortion in the sampled signal caused by the sampling clock signal.

8. The method of claim 7, wherein generating the offset signal comprises:
shifting a phase of the sampling clock signal to produce a shifted sampling clock signal; and
applying the scaling factor to the shifted sampling clock signal to produce the offset signal.

9. The method of claim 7, wherein generating the offset signal comprises:
dividing the sampling clock signal to produce a divided sampling clock signal;
generating an oscillating signal based on the divided sampling clock signal; and
applying the scaling factor to the oscillating signal to produce the offset signal.

10. The method of claim 9, further comprising applying a phase adjustment to the divided sampling clock signal before generating the oscillating signal.

11. The method of claim 7, wherein the scaling factor is determined based on a detected power of the sampled signal.

12. The method of claim 7, further comprising sampling a second input signal according to the sampling clock signal to produce a second sampled signal, wherein offset signal further reduces distortion in the second sampled signal caused by the sampling clock signal.

13. An apparatus comprising:
a sense circuit configured to determine a scaling factor based on a distortion in a sampled signal caused by a sampling clock signal used to generate the sampled signal; and
a tuning circuit configured to generate an offset signal based on the sampling clock signal and the scaling factor; and
a mixer configured to multiply the offset signal with the sampled signal to reduce the distortion in the sampled signal caused by the sampling clock signal.

14. The apparatus of claim 13, wherein the tuning circuit comprises:
a phase shifter configured to shift a phase of the sampling clock signal to produce a shifted sampling clock signal; and
a variable attenuator configured to apply the scaling factor to the shifted sampling clock signal to produce the offset signal.

15. The apparatus of claim 13, wherein the tuning circuit comprises:
a clock divider configured to divide the sampling clock signal to produce a divided sampling clock signal; and
a numerically controlled oscillator configured to:
generate an oscillating signal based on the divided sampling clock signal; and
apply the scaling factor to the oscillating signal to produce the offset signal.

16. The apparatus of claim 15, wherein the numerically controlled oscillator is further configured to apply a phase adjustment to the divided sampling clock signal before generating the oscillating signal.

17. The apparatus of claim 13, wherein the sense circuit determines the scaling factor based on a detected power of the sampled signal.

* * * * *